(12) United States Patent
Nishikawa et al.

(10) Patent No.: US 10,381,827 B2
(45) Date of Patent: Aug. 13, 2019

(54) SEMICONDUCTOR INTEGRATED CIRCUIT DEVICE

(71) Applicant: FUJI ELECTRIC CO., LTD., Kawasaki-shi, Kanagawa (JP)

(72) Inventors: Mutsuo Nishikawa, Matsumoto (JP); Kazuhiro Matsunami, Matsumoto (JP); Katsuhiro Shimazu, Goshogawara (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 268 days.

(21) Appl. No.: 15/609,535

(22) Filed: May 31, 2017

(65) Prior Publication Data

US 2017/0366004 A1    Dec. 21, 2017

(30) Foreign Application Priority Data

Jun. 16, 2016    (JP) .................. 2016-120281

(51) Int. Cl.
*H02H 9/04* (2006.01)
*H01L 23/528* (2006.01)
(Continued)

(52) U.S. Cl.
CPC ........... *H02H 9/046* (2013.01); *H01L 23/528* (2013.01); *H01L 27/0255* (2013.01);
(Continued)

(58) Field of Classification Search
CPC . H02H 9/00; H02H 9/04; H02H 9/046; H01L 21/70; H01L 21/822;
(Continued)

(56) References Cited

U.S. PATENT DOCUMENTS 7,742,265 B2 * 6/2010 Rice ................. H01L 27/0266
361/56
8,726,046 B2 * 5/2014 Tajima ............. H01L 27/0285
361/56
(Continued)

FOREIGN PATENT DOCUMENTS

JP    S63-255956 A    10/1988
JP    2804333 B2    9/1998
(Continued)

*Primary Examiner* — Tuan T Dinh
(74) *Attorney, Agent, or Firm* — Rabin & Berdo, P.C.

(57) ABSTRACT

A protection circuit includes a first PMOS and a first PDMOS receiving input of voltage of a voltage dividing point of voltage input from an external power supply terminal, and a second PMOS and a second PDMOS receiving input of drain output voltage of the first PDMOS. The first PMOS is connected on the external power supply terminal side of the first PDMOS, and the second PMOS is connected on the external power supply terminal side of the second PDMOS. During overvoltage application, the voltage of the voltage dividing point is clamped to the breakdown voltage of a Zener diode, the second PDMOS turns OFF, and supply to an integrated circuit protected from overvoltage is cut off. When the voltage source is connected in reverse, parasitic diodes of the first and second PMOSs are reverse-biased and the flow of current in a path through the parasitic diodes is inhibited.

11 Claims, 8 Drawing Sheets

(51) Int. Cl.
   *H01L 27/02* (2006.01)
   *H01L 27/06* (2006.01)
   *H01L 27/088* (2006.01)
   *H03K 19/003* (2006.01)
   *H02H 3/20* (2006.01)
   *H02H 11/00* (2006.01)
   *H03K 3/356* (2006.01)
   *H01L 21/8234* (2006.01)

(52) U.S. Cl.
   CPC ...... *H01L 27/0266* (2013.01); *H01L 27/0285* (2013.01); *H01L 27/0629* (2013.01); *H01L 27/0883* (2013.01); *H02H 3/202* (2013.01); *H02H 11/003* (2013.01); *H03K 19/00315* (2013.01); *H01L 21/823418* (2013.01); *H01L 27/088* (2013.01); *H03K 3/356* (2013.01)

(58) Field of Classification Search
   CPC ........... H01L 21/8238; H01L 23/58–62; H01L 27/04; H01L 27/06; H01L 27/085; H01L 27/092; H01L 2224/48091; H01L 2224/48195; H01L 2924/00; H01L 2924/13055; H01L 2924/13091; H03K 17/0826–0828
   USPC ................. 361/56, 30, 39, 71; 327/178–180, 327/291–313
   See application file for complete search history.

(56) References Cited

U.S. PATENT DOCUMENTS

| | | | |
|---|---|---|---|
| 2003/0214769 A1 | 11/2003 | Nishikawa et al. | |
| 2007/0058306 A1* | 3/2007 | Poulton | H01L 27/0285 361/56 |
| 2012/0250198 A1 | 10/2012 | Sudo | |
| 2015/0085406 A1* | 3/2015 | Chen | H02H 9/046 361/55 |
| 2015/0138679 A1* | 5/2015 | Venkatasubramanian | H02H 9/046 361/56 |
| 2015/0287712 A1 | 10/2015 | Kitajima | |
| 2016/0056811 A1* | 2/2016 | Wadhwa | H03K 17/223 327/143 |

FOREIGN PATENT DOCUMENTS

| | | |
|---|---|---|
| JP | H10-289956 A | 10/1998 |
| JP | 2002-095159 A | 3/2002 |
| JP | 2003-303890 A | 10/2003 |
| JP | 2014-082922 A | 5/2014 |
| JP | 5603277 B2 | 10/2014 |

\* cited by examiner

FIG.6

| OPERATION STATE | SECOND PMOS | | SECOND PDMOS |
|---|---|---|---|
| | ENHANCEMENT TYPE | DEPRESSION TYPE | ENHANCEMENT TYPE |
| STEADY-STATE | ON (INVERSION STATE) | ON (INVERSION STATE) | ON (INVERSION STATE) |
| OVERCURRENT APPLICATION | OFF (NON-INVERSION STATE) | ON (WEAK INVERSION STATE) * HIGHER RESISTANCE THAN NORMAL INVERSION STATE | OFF (NON-INVERSION STATE) |
| REVERSE CONNECTION | OFF (NON-INVERSION STATE) | WHEN THRESHOLD IS -1.2 TO 0V: OFF (INVERSION) WHEN THRESHOLD IS LESS THAN 1.2V: ON (WEAK INVERSION) | OFF (NON-INVERSION STATE) |

SEMICONDUCTOR INTEGRATED CIRCUIT DEVICE

CROSS REFERENCE TO RELATED APPLICATIONS

This application is based upon and claims the benefit of priority of the prior Japanese Patent Application No. 2016-120281, filed on Jun. 16, 2016, the entire contents of which are incorporated herein by reference.

BACKGROUND OF THE INVENTION

1. Field of the Invention

Embodiments of the invention relate to a semiconductor integrated circuit device.

2. Description of the Related Art

Conventionally, physical quantity sensors such as pressure sensors have been used for automotive applications (on-vehicle use). In such cases, typically, the power supply voltage supplied to the physical quantity sensor is not the maximum voltage (12V, 24V, or 48V) output by a battery directly, but rather 5V stabilized by converting the maximum voltage of the battery through a regulator. However, wiring of the power supply system may be misconnected at the time of assembly, voltage of the battery may be directly supplied to the physical quantity sensor side due to malfunction or failure of the regulator, and other similar situations are conceivable. Various overvoltage protection functions that protect the physical quantity sensor from overvoltage have been devised as countermeasures.

One such overvoltage protection function proposed includes a voltage divider constituted by a Zener diode and a resistor element dividing the voltage supplied from an external power supply terminal, a signal generator receiving input of the voltage of the voltage dividing point of the voltage divider, and a switch opening and closing according to the output of the signal generator (for example, refer to Japanese Laid-Open Patent Publication No. 2003-303890).

Configuration of a conventional overvoltage protection circuit will be described. FIG. 8 is a circuit diagram of a conventional overvoltage protection circuit. FIG. 8 corresponds to FIG. 1 of Japanese Laid-Open Patent Publication No. 2003-303890. A conventional overvoltage protection circuit 201 includes a voltage divider 202, a signal generator 203, and a switch 204, and protects an integrated circuit 205 from overvoltage. The voltage divider 202 is a voltage divider resistor constituted by a first resistor element 221 and a Zener diode 222. Reference character 223 is a connection point of the first resistor element 221 and the Zener diode 222, i.e., the voltage dividing point (output point) of the voltage divider 202.

The signal generator 203 includes a first p-channel metal oxide semiconductor field effect transistor ((MOSFET) hereinafter, PDMOS) 231 and a second resistor element 232. The switch 204 includes a second PDMOS 241. The integrated circuit 205 operates using, as a maximum voltage, an internal power supply voltage Vdd supplied from an internal power supply terminal 213 and uses, as a reference voltage, a ground voltage GND supplied from a ground terminal 212.

In the overvoltage protection circuit 201 depicted in FIG. 8, when a power supply voltage Vcc applied to an external power supply terminal 211 is lower than a breakdown voltage Vr of the Zener diode 222, divided voltage ga output from the voltage divider 202 and resulting from dividing the power supply voltage Vcc becomes about the power supply voltage Vcc. Since the absolute value of the difference of the power supply voltage Vcc and the voltage ga is small, the drain output voltage of the first PDMOS 231 becomes about the ground voltage GND, the second PDMOS 241 enters an ON state, and the power supply voltage Vcc is supplied to the internal power supply terminal 213.

On the other hand, when the power supply voltage Vcc is the breakdown voltage Vr or higher, breakdown of the Zener diode 222 occurs and the voltage ga output from the voltage divider 202 is clamped to the breakdown voltage Vr. As a result, the absolute difference of the power supply voltage Vcc and the voltage ga (=Vr) becomes large and the drain output voltage of the first PDMOS 231 becomes about the power supply voltage Vcc. Therefore, the second PDMOS 241 enters an OFF state and the supply of the power supply voltage Vcc to the internal power supply terminal 213 is cut off.

Further, in the field of automotive application, a problem of a failure mode consequent to human error may be observed when a voltage source is connected by wiring to an external power supply terminal and ground terminal, and the power supply wiring and ground wiring are inadvertently connected in reverse (so-called reversed connection). Therefore, various protection functions of protecting a circuit (integrated circuit or internal circuit thereof) to be protected in a case of reversed connection of the voltage source have been devised.

One proposed protection function against reversed connection of the voltage source is implemented by connecting a collector of an npn transistor to a terminal for ground connection of a complementary MOS (CMOS) integrated circuit, connecting an emitter of the npn transistor to a terminal to which connection should actually be made for grounding, and connecting a base to a terminal that should be of the actual reference potential (for example, refer to Japanese Laid-Open Patent Publication No. H10-289956). In Japanese Laid-Open Patent Publication No. H10-289956, when the voltage source is correctly connected to the CMOS integrated circuit, base current is supplied from the terminal that should be of the actual reference potential to the npn transistor, the npn transistor turns ON, and voltage supply to the CMOS integrated circuit is established. On the other hand, when the voltage source is connected in reverse to CMOS integrated circuit, base current is not supplied from the terminal that should be of the actual reference potential to the npn transistor, the npn transistor turns OFF, and no current flows to the CMOS integrated circuit whereby the CMOS integrated circuit is protected from overcurrent (surge current).

Another proposed protection function against reversed connection of the voltage source is implemented by connecting between a ground terminal and a ground wiring line, an n-channel MOSFET (hereinafter, NMOS) as a switch for electrical connection and disconnection between the ground terminal and the ground wiring line (for example, refer to Japanese Laid-Open Patent Publication No. 2002-095159). In Japanese Laid-Open Patent Publication No. 2002-095159, when the voltage source is correctly connected to the integrated circuit, the NMOS, which is a switch, turns ON, establishing voltage supply to the integrated circuit. On the other hand, when the voltage source is connected to the integrated circuit in reverse, the NMOS, which is a switch, turns OFF, and the voltage supply path to the integrated circuit is disconnected and consequently, voltage supply to the integrated circuit is not established. Additionally, a parasitic diode of the NMOS is reverse-biased and forward current does not flow in the integrated circuit whereby the OFF state of the NMOS is maintained.

Another proposed protection function against reversed connection of the voltage source is implemented by connecting between a power supply terminal and a ground terminal, an ordinary electro-static discharge (ESD) protection element that protects the integrated circuit from ESD and is constituted by an MOSFET, and further connecting serially two p-channel MOSFETs (hereinafter, PMOSs) to the ESD protection element (for example, refer to Japanese Patent No. 5603277). In Japanese Patent No. 5603277, when the voltage source is correctly connected to the integrated circuit, the two PMOSs connected in series to the ESD protection element also function as ESD protection elements. On the other hand, when the voltage source is connected to the integrated circuit in reverse, parasitic diodes of the two PMOSs connected in series to the ESD protection element are reverse-biased, and a path through which forward current flows is not formed. As a result, current consequent to the reversed connection of the voltage source does not flow in the ESD protection element and the ESD protection element provides protection from overcurrent.

Another proposed protection function against reversed connection of the voltage source is implemented by providing a surge absorption circuit connected to a power input terminal, a PMOS provided at the next stage downstream from the surge absorption circuit, and a reverse-biased Zener diode connected between the source and gate electrodes of the PMOS (for example, refer to Japanese Patent No. 2804333). In Japanese Patent No. 2804333, when the voltage source is correctly connected to the integrated circuit, the PMOS turns ON and voltage supply to the integrated circuit is established. The voltage supplied within the integrated circuit is voltage that is lower than the power supply voltage rectified by the Zener diode. On the other hand, when the voltage source is connected to the integrated circuit in reverse, the PMOS turns OFF and current is not supplied to the integrated circuit, protecting the integrated circuit from overcurrent.

Another proposed protection function against reversed connection of the voltage source is implemented by arranging two NMOSs driving a gate by voltage from the power supply terminal and the ground terminal of the integrated circuit, the NMOSs are between the power supply terminal and the ground terminal, and between an internal power source node and internal ground node, (for example, refer to Japanese Laid-Open Patent Publication No. 2014-082922). In Japanese Laid-Open Patent Publication No. 2014-082922, when the voltage source is correctly connected to the integrated circuit, the first NMOS turns ON and the second NMOS turns OFF whereby voltage supply to an internal circuit is established. On the other hand, when the voltage source is connected to the integrated circuit in reverse, the first NMOS turns OFF and a current path to the internal circuit is cut off, protecting the internal circuit from overcurrent. Additionally, the second NMOS turns ON whereby the voltage of the internal power source node and the voltage of the internal ground node both become the ground potential supplied from the voltage source and operation of the internal circuit is suspended.

Another proposed protection function against reversed connection of the voltage source suppresses current flowing in a semiconductor substrate when the voltage source is connected in reverse to a bipolar integrated circuit arranged on the semiconductor substrate; the current is suppressed by a resistor component of a $p^+$-type base region of the bipolar integrated circuit (for example, refer to Japanese Laid-Open Patent Publication No. S63-255956). Japanese Laid-Open Patent Publication No. S63-255956 further discloses use of a poly-silicon (poly-Si) resistor in place of the $p^+$-type base region that is a diffusion resistor.

SUMMARY OF THE INVENTION

According to one aspect of the present invention, a semiconductor integrated circuit device includes an external power supply terminal supplied a power supply voltage from outside the semiconductor integrated circuit device, in a steady-state; a ground terminal supplied a ground voltage from outside the semiconductor integrated circuit device, in the steady-state; an internal power supply terminal supplying, to an integrated circuit to be protected, the power supply voltage supplied from outside the semiconductor integrated circuit device, in the steady-state; a voltage divider dividing voltage supplied from the external power supply terminal, the voltage divider connected between the external power supply terminal and the ground terminal; a signal generator including an inverter circuit formed by a serially-connected member formed by connecting a first end of a first resistor element to a drain terminal of a first metal oxide semiconductor field effect transistor connected between the external power supply terminal and the ground terminal, the first metal oxide semiconductor field effect transistor outputting any one of the power supply voltage and the ground voltage according to a voltage of a voltage dividing point of the voltage divider, the first metal oxide semiconductor field effect transistor having, as an input terminal, a gate terminal connected to the voltage dividing point, and having a drain terminal as an output terminal; and a switch switching output of the signal generator, the switch including a second metal oxide semiconductor field effect transistor connected between the external power supply terminal and the ground terminal, a drain terminal of the second metal oxide semiconductor field effect transistor being connected to the internal power supply terminal, and a gate terminal of the second metal oxide semiconductor field effect transistor being connected to a first connection point of the drain terminal of the first metal oxide semiconductor field effect transistor and the first end of the first resistor element. The signal generator further includes a third metal oxide semiconductor field effect transistor, a drain terminal of the third metal oxide semiconductor field effect transistor being connected to the external power supply terminal, a source terminal of the third metal oxide semiconductor field effect transistor being connected to a source terminal of the first metal oxide semiconductor field effect transistor, and a gate terminal of the third metal oxide semiconductor field effect transistor being connected to the voltage dividing point. The switch further includes a fourth metal oxide semiconductor field effect transistor, a drain terminal of the fourth metal oxide semiconductor field effect transistor being connected to the external power supply terminal, a source terminal of the fourth metal oxide semiconductor field effect transistor being connected to a source terminal of the second metal oxide semiconductor field effect transistor, and a gate terminal of the fourth metal oxide semiconductor field effect transistor being connected to the first connection point.

In the semiconductor integrated circuit device, the third metal oxide semiconductor field effect transistor is an enhancement-type p-channel metal oxide semiconductor field effect transistor.

In the semiconductor integrated circuit device, the fourth metal oxide semiconductor field effect transistor is an enhancement-type p-channel metal oxide semiconductor field effect transistor.

In the semiconductor integrated circuit device, the third metal oxide semiconductor field effect transistor is a depression-type p-channel metal oxide semiconductor field effect transistor.

In the semiconductor integrated circuit device, the fourth metal oxide semiconductor field effect transistor is a depression-type p-channel metal oxide semiconductor field effect transistor.

In the semiconductor integrated circuit device, a gate threshold voltage of the fourth metal oxide semiconductor field effect transistor is set so that voltage applied to the gate terminal becomes higher than voltage applied to the source terminal, when the ground voltage is supplied to the external power supply terminal and the power supply voltage is supplied to the ground terminal.

In the semiconductor integrated circuit device, the first metal oxide semiconductor field effect transistor and the second metal oxide semiconductor field effect transistor are each an enhancement-type p-channel metal oxide semiconductor field effect transistor.

In the semiconductor integrated circuit device, the voltage divider is formed by a second serially-connected member in which a Zener diode is connected in series to the second resistor element, and a breakdown voltage of the Zener diode is a maximum rated voltage of the integrated circuit or less.

In the semiconductor integrated circuit device, the integrated circuit is constituted by multiple metal oxide semiconductor field effect transistors.

In the semiconductor integrated circuit device, the voltage divider, the signal generator, and the switch are formed on a single semiconductor substrate with the integrated circuit.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a table of states of a channel portion of a PMOS and a PDMOS depicted in FIG. 5;

DETAILED DESCRIPTION OF THE INVENTION

Figure 1:
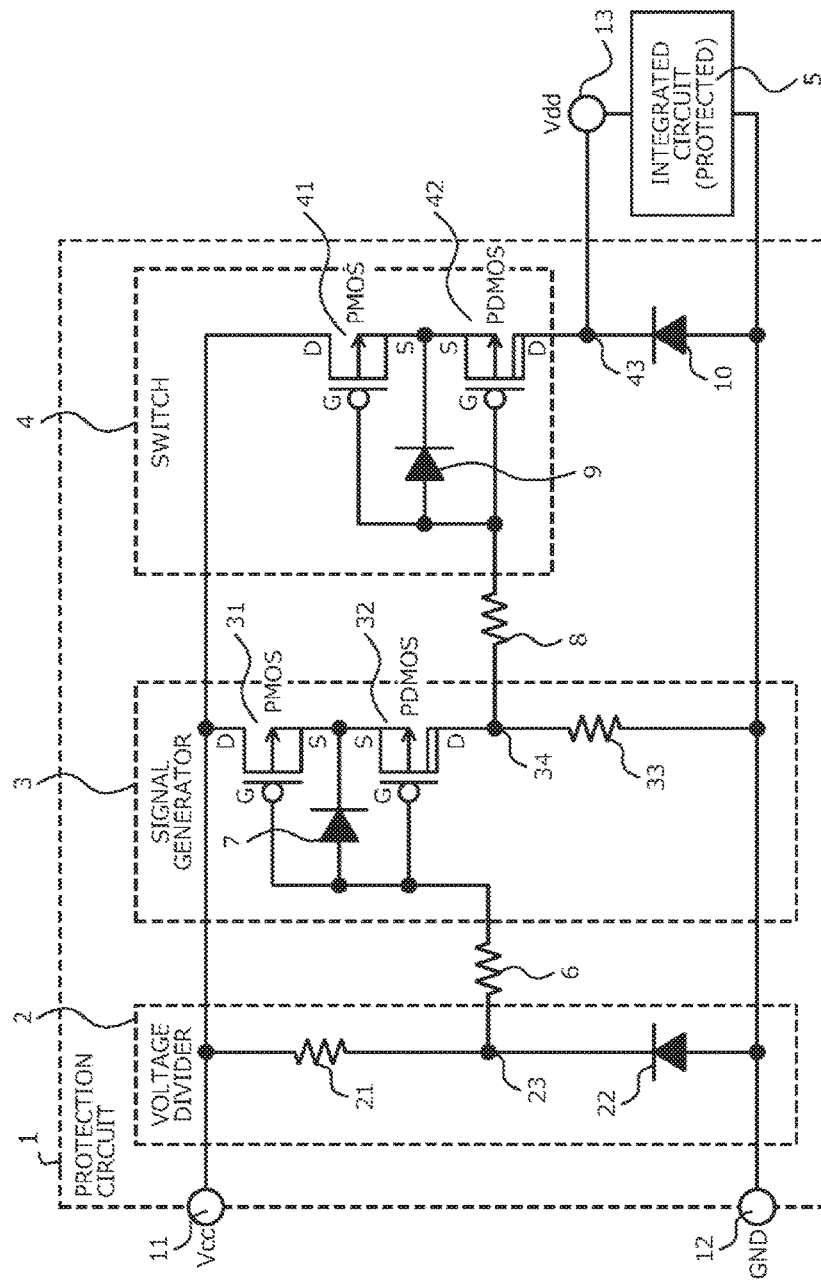
FIG. 1 is a circuit diagram of a semiconductor integrated circuit device according to an embodiment.

Embodiments of a semiconductor integrated circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical will be given the same reference numerals and will not be repeatedly described.

Circuit configuration of the semiconductor integrated circuit device according to an embodiment will be described. FIG. 1 is a circuit diagram of the semiconductor integrated circuit device according to the embodiment. The semiconductor integrated circuit device depicted in FIG. 1 includes on a single semiconductor substrate, a protection circuit 1 and an integrated circuit 5 protected by the protection circuit 1. The protection circuit 1 includes a voltage divider 2, a signal generator 3, and a switch 4.

The protection circuit 1 has a function of protecting the integrated circuit 5 from overvoltage and a function of inhibiting the flow of current to the integrated circuit 5 when the voltage source is connected in reverse. The integrated circuit 5, for example, is a CMOS integrated circuit configured to operate based on the power supply voltage Vcc applied to an external power supply terminal 11, using the internal power supply voltage Vdd supplied from an internal power supply terminal 13 as a maximum voltage and the ground voltage GND supplied from a ground terminal 12 as a reference voltage.

Reversed connection of the voltage source is an errant connection of polarities of an external voltage source (not depicted) to the external power supply terminal 11 and the ground terminal 12 of the integrated circuit 5, i.e., the negative electrode and the positive electrode of the voltage source are connected to the external power supply terminal 11 and the ground terminal 12, respectively. When the voltage source is correctly connected to the external power supply terminal 11 and the ground terminal 12, the positive electrode and the negative electrode of the voltage source are connected to the external power supply terminal 11 and the ground terminal 12, respectively.

The voltage divider 2 includes a first resistor element 21 and a first Zener diode 22. The voltage divider 2 is a voltage divider resistor that divides the power supply voltage Vcc supplied to the external power supply terminal 11. One end of the first resistor element 21 is connected to the external power supply terminal 11 and the other end is connected to the cathode terminal of the first Zener diode 22. The anode terminal of the first Zener diode 22 is connected to the ground terminal 12. In place of the first Zener diode 22, a resistor element may be used.

The signal generator 3 includes a p-channel MOSFET (hereinafter, first PMOS (third metal oxide semiconductor field effect transistor) 31, a p-channel high-voltage MOSFET (hereinafter, a first PDMOS (first metal oxide semiconductor field effect transistor) 32, and a second resistor element 33. The first PMOS 31 is arranged farther on the high-potential side than the first PDMOS 32 is. The first PDMOS 32 and the second resistor element 33 constitute an inverter circuit.

In particular, the first PDMOS 32 may be a high-voltage PDMOS to provide protection when the power supply voltage Vcc applied to the external power supply terminal 11 is overvoltage. For example, when the semiconductor integrated circuit device of the present invention is used on an automobile and the predetermined normal power supply voltage Vcc applied to the external power supply terminal 11 is 5V, the first PDMOS 32 may have an element breakdown voltage enabling resistance to breakdown even when the battery power supply voltage of 12V is errantly applied to the external power supply terminal 11.

In particular, a drain terminal D of the first PMOS 31 is connected to the external power supply terminal 11. A gate terminal G of the first PMOS 31 is connected to the cathode terminal of the first Zener diode 22 (i.e., a voltage dividing point (output point) 23 of the voltage divider 2), via a third resistor element 6. Further, the gate terminal G of the first PMOS 31 is further connected to a source terminal S of the first PMOS 31, via a second Zener diode 7. The source terminal S of the first PMOS 31 is further connected to the source terminal S of the first PDMOS 32.

The first PMOS 31 has a function of inhibiting the flow of current in a case of reversed connection of the voltage source. The first PDMOS 32 has a function of protecting the integrated circuit 5 from overvoltage. Further, the first PMOS 31 and the first PDMOS 32 have a function of protecting the integrated circuit 5 from surge current entering from the external power supply terminal 11, by absorbing the surge current.

The first PMOS 31 may be any one of an enhancement (normally OFF) type and a depression (normally ON) type. For example, in cases when the first PDMOS 32 is to be assuredly turned ON/OFF at the time of overvoltage application, the first PMOS 31 is to be assuredly turned OFF in a case of reversed connection of the voltage source, the second resistor element 33 is to have a low resistance and the chip area is to be reduced, etc., the first PMOS 31 may be an enhancement type and have high resistance. On the other hand, when the second resistor element 33 is to have high resistance (for example, about 100 kΩ), the first PMOS 31 may be an enhancement type or a depression type.

When the first PMOS 31 is a depression type, the resistance value of a current path through the first PMOS 31 in a steady-state may be reduced without increasing the chip area, enabling further improvement of the accuracy of the product overall. Further, when the first PMOS 31 is a depression type, the resistance value of the second resistor element 33 may be made higher (for example, about several hundred kΩ) than the ON resistance (for example, about 1 kΩ) of the first PDMOS 32. As a result, current along a path through the first PMOS 31 in a case of reversed connection of the voltage source may be reduced (controlled) using the second resistor element 33, not only the first PMOS 31.

The drain terminal D of the first PDMOS 32 is connected to one end of the second resistor element 33. The gate terminal G of the first PDMOS 32 is connected to the cathode terminal of the first Zener diode 22, via the third resistor element 6. The gate terminal G of the first PDMOS 32 is further connected to the source terminal S of the first PDMOS 32, via the second Zener diode 7. The other end of the second resistor element 33 is connected to the ground terminal 12. The gate threshold voltage of the first PDMOS 32 is equal to the gate threshold voltage of the first PMOS 31. The first PDMOS 32 is an enhancement type.

The third resistor element 6 has a function of suppressing current flowing along a path of the first PMOS 31, the second Zener diode 7, and the first Zener diode 22 at the time of overvoltage application. The resistance value of the third resistor element 6 may be, for example, about a few dozen kΩ. The cathode terminal side of the second Zener diode 7 is on the source terminal S sides of the first PMOS 31 and of the first PDMOS 32; and the second Zener diode 7 is connected between the source terminals S and the gate terminals G of the first PMOS 31 and of the first PDMOS 32. The second Zener diode 7 has a function of protecting the first PMOS 31 and the first PDMOS 32 from surge current by reducing the surge current entering from the external power supply terminal 11, by reducing the surge current.

The switch 4 includes a p-channel MOSFET (hereinafter, second PMOS (second metal oxide semiconductor field effect transistor)) 41 and a p-channel high-voltage MOSFET (hereinafter, second PDMOS (fourth metal oxide semiconductor field effect transistor)) 42. The second PDMOS 42, similar to the first PDMOS 32, may be a high-voltage PDMOS.

The drain terminal D of the second PMOS 41 is connected to the external power supply terminal 11. The gate terminal G of the second PMOS 41 is connected to a connection point 34 of the drain terminal D of the first PDMOS 32 and the second resistor element 33, via a fourth resistor element 8. Further, the gate terminal G of the second PMOS 41 is further connected to the source terminal S of the second PMOS 41, via a third Zener diode 9. The source terminal S of the second PMOS 41 is further connected to the source terminal S of the second PDMOS 42.

The second PMOS 41 has a function of inhibiting the flow of current in a case of reversed connection of the voltage source. The second PDMOS 42 has function of protecting the integrated circuit 5 from overvoltage. Further, the second PMOS 41 and the second PDMOS 42 have a function of protecting the integrated circuit 5 from surge current entering from the external power supply terminal 11, by absorbing the surge current.

Although the second PMOS 41 may be any one of an enhancement type and a depression type, a depression type is preferable. Forming the second PMOS 41 to be a depression type enables the resistance value of a path of current Idd (refer to FIG. 2) passing through the second PMOS 41 in the steady-state to be reduced without increasing the chip area and enables the accuracy of the product overall to be improved.

In particular, the current Idd passing through the second PMOS 41 in the steady-state is supplied from the external power supply terminal 11, through the second PMOS 41 and the second PDMOS 42, to the internal power supply terminal 13. The current Idd affects the driving performance of the integrated circuit 5 and has a large current value. Therefore, reduction of the resistance value of the path of the current Idd passing through the second PMOS 41 in the steady-state significantly contributes to improving the accuracy of the product overall.

Further, when the second PMOS 41 is a depression type, the gate threshold voltage of the second PMOS 41 is set so that, in a case of reversed connection of the voltage source, the voltage applied to the gate terminal G becomes higher than the voltage applied to the source terminal S. In particular, the gate threshold voltage of the second PMOS 41 is lower than a voltage value that is a sum of forward voltage of a parasitic diode 64 of the second PMOS 41 and forward voltage of a fourth Zener diode 10. As a result, in a case of reversed connection of the voltage source, the second PMOS 41 may be put in a substantially OFF state.

The drain terminal D of the second PDMOS 42 is connected to the internal power supply terminal 13. The gate terminal G of the second PDMOS 42 is connected to the connection point 34 of the drain terminal D of the first PDMOS 32 and the second resistor element 33, via the fourth resistor element 8. The gate terminal G of the second PDMOS 42 is further connected to the source terminal S of the second PDMOS 42, via the third Zener diode 9. The gate threshold voltage of the second PDMOS 42 is equal to the gate threshold voltage of the second PMOS 41. The second PDMOS 42 is an enhancement type.

The fourth resistor element 8 has a function of suppressing current flowing along a path of the second PMOS 41, the third Zener diode 9, and the second resistor element 33 at the time of overvoltage application. The resistance value of the fourth resistor element 8 may be, for example, about a few dozen kΩ. The cathode terminal side of the third Zener diode 9 is on the source terminal S sides of the second PMOS 41 and the second PDMOS 42; and the third Zener diode 9 is connected between the source terminals S and the gate terminals G of the second PMOS 41 and the second PDMOS 42. The third Zener diode 9 has a function of protecting the second PMOS 41 and the second PDMOS 42 from surge current entering from the external power supply terminal 11, by reducing the surge current.

The integrated circuit 5 is connected between the internal power supply terminal 13 and the ground terminal 12. The cathode terminal of the fourth Zener diode 10 is connected to a connection point (first connection point) 43 of the drain terminal D of the second PDMOS 42 and the internal power supply terminal 13. The anode terminal of the fourth Zener diode 10 is connected to the ground terminal 12. Even when surge current entering from the external power supply terminal 11 is not completely absorbed by the second PMOS 41 and the second PDMOS 42, the surge current may be reduced by the fourth Zener diode 10 connected in parallel to the integrated circuit 5. Therefore, surge current may be suppressed from entering the integrated circuit 5.

Operation of the protection circuit 1 (refer to FIG. 1) will be described taking a case in which the second PMOS 41 and the first PMOS 31 of an enhancement type are used.

Figure 2:
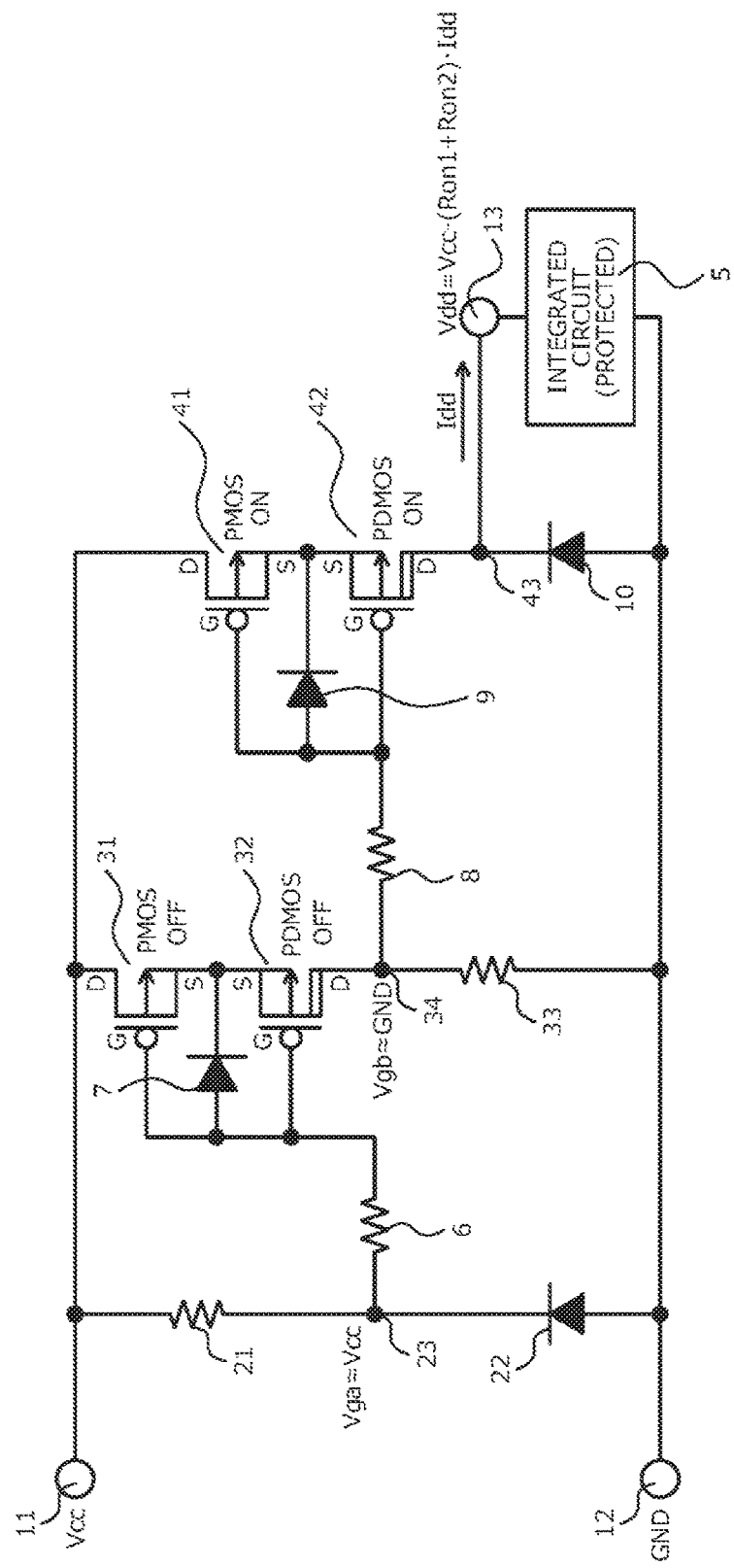
FIG. 2 is a diagram depicting a steady-state of a protection circuit depicted in FIG. 1.

Steady-state operation of the protection circuit 1 will be described. FIG. 2 is a diagram depicting the steady-state of the protection circuit depicted in FIG. 1. The steady-state is a case in which the voltage source is correctly connected and the power supply voltage Vcc applied to the external power supply terminal 11 is less than a voltage value that is a sum of the breakdown voltage Vr of the first Zener diode 22 and a gate threshold voltage Vth of the first PDMOS 32 (Vcc<Vr+Vth). The breakdown voltage Vr of the first Zener diode 22 is the maximum rated voltage of the integrated circuit 5 or less.

As depicted in FIG. 2, in the steady-state, since breakdown of the first Zener diode 22 does not occur, divided voltage (voltage of a voltage dividing point 23 of the voltage divider 2) Vga output from the voltage dividing point 23 of the voltage divider 2 and resulting from dividing the power supply voltage Vcc becomes about the power supply voltage Vcc (Vga≈Vcc). In other words, the gate voltages (≈Vga) of the first PMOS 31 and of the first PDMOS 32 becomes about the power supply voltage Vcc; and the first PMOS 31 and the first PDMOS 32 maintain the OFF state.

Consequent to the first PMOS 31 and the first PDMOS 32 being OFF, a voltage Vgb of the connection point 34 of the drain terminal D of the first PDMOS 32 and the second resistor element 33 becomes about the ground voltage GND (Vgb≈GND). In other words, the gate voltages (≈Vgb) of the second PMOS 41 and of the second PDMOS 42 become about the ground voltage GND; and the second PMOS 41 and the second PDMOS 42 turn ON.

Consequent to the second PMOS 41 and the second PDMOS 42 being ON, the internal power supply voltage Vdd from the internal power supply terminal 13 is supplied to the integrated circuit 5. The internal power supply voltage Vdd of the internal power supply terminal 13 is expressed by equation (1). In equation (1), Ron1 and Ron2 are the ON resistances of the second PMOS 41 and the second PDMOS 42, respectively. Idd is the current supplied from the external power supply terminal 11 to the internal power supply terminal 13 through the second PMOS 41 and the second PDMOS 42, in the steady-state.

$$Vdd=Vcc-(Ron1+Ron2)\times Idd \qquad (1)$$

Figure 3:
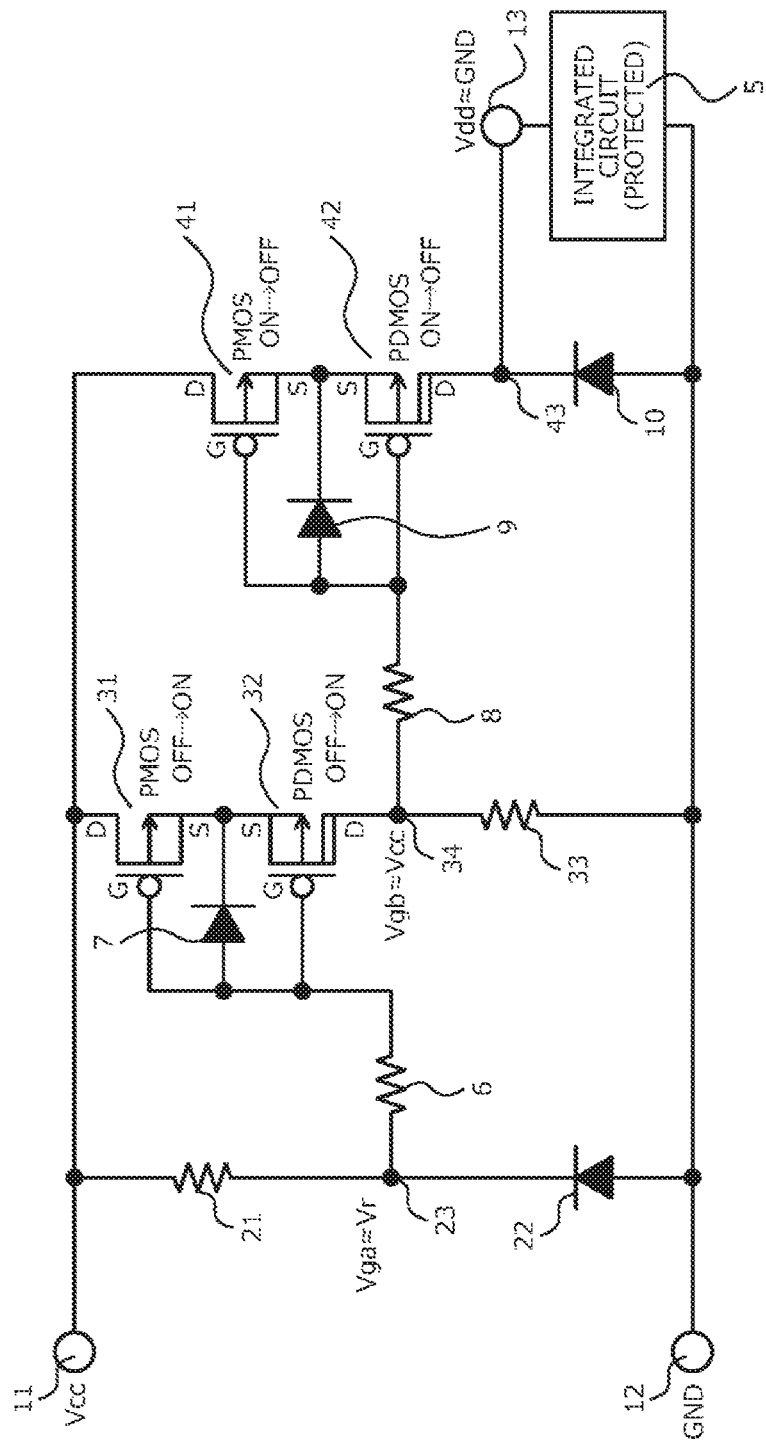
FIG. 3 is a diagram depicting a state of overvoltage application of the protection circuit depicted in FIG. 1.

Operation at the time of overvoltage application of the protection circuit 1 will be described. FIG. 3 is a diagram depicting a state of overvoltage application of the protection circuit depicted in FIG. 1. A case of overvoltage application is a case in which the steady-state becomes a state in which the applied power supply voltage Vcc from the external power supply terminal 11 exceeds the breakdown voltage Vr of the first Zener diode 22. As depicted in FIG. 3, in a case of overvoltage application, when the power supply voltage Vcc applied to the external power supply terminal 11 exceeds the breakdown voltage Vr of the first Zener diode 22, breakdown on the first Zener diode 22 occurs.

Consequent to the breakdown of the first Zener diode 22, the voltage Vga of the voltage dividing point 23 of the voltage divider 2 is clamped to the breakdown voltage Vr of the first Zener diode 22 and the absolute value of the difference of the power supply voltage Vcc and the voltage Vga of the voltage dividing point 23 of the voltage divider 2 (≈Vr) increases. Furthermore, the power supply voltage Vcc increases and when the power supply voltage Vcc becomes a voltage value (overvoltage threshold voltage) that is a sum of the breakdown voltage Vr of the first Zener diode 22 and the gate threshold voltage Vth of the first PDMOS 32 or higher (Vcc≥Vr+Vth), the first PMOS 31 and the first PDMOS 32 transition from the OFF state to the ON state.

Consequent to the first PMOS 31 and the first PDMOS 32 turning ON, the voltage Vgb of the connection point 34 of the drain terminal D of the first PDMOS 32 and the second resistor element 33 becomes about the power supply voltage Vcc (Vgb≈Vcc). As a result, the second PMOS 41 and the second PDMOS 42 transition from the ON state to the OFF state. Consequent to the second PMOS 41 and the second PDMOS 42 turning OFF, the potential of the power supply voltage Vcc of the internal power supply terminal 13 may be reduced whereby the integrated circuit 5 is protected from overvoltage.

Figure 4:
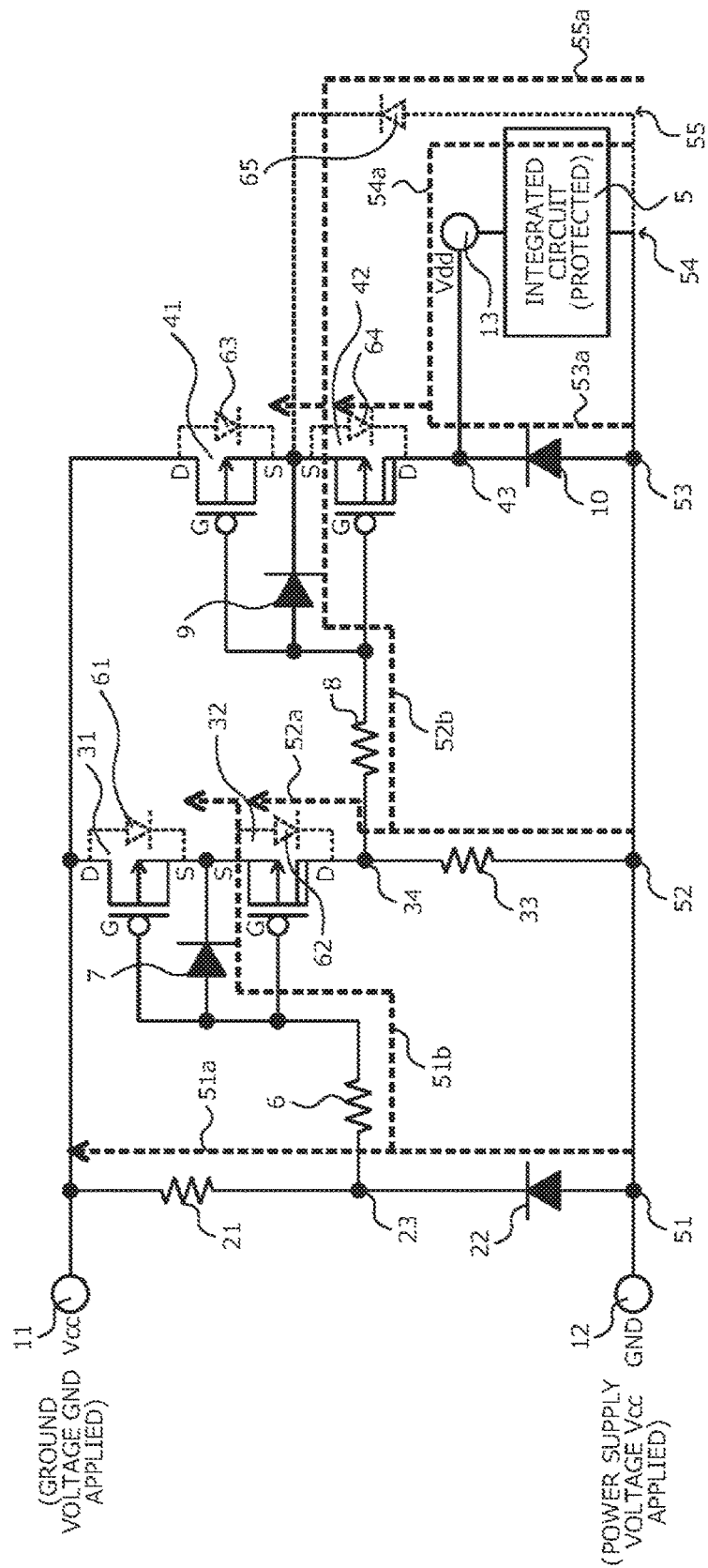
FIG. 4 is a diagram depicting current paths in a case of reversed connection of a voltage source of the protection circuit depicted in FIG. 1.

Operation of the protection circuit 1 in a case of reversed connection of the voltage source will be described. FIG. 4 is a diagram depicting current paths in a case of reversed connection of the voltage source of the protection circuit depicted in FIG. 1. As depicted in FIG. 4, when the voltage source is connected to the external power supply terminal 11 and the ground terminal 12 in reverse, the ground voltage GND is applied to the external power supply terminal 11, and the power supply voltage Vcc is connected to the ground terminal 12. At this time, the voltage applied to the gate terminal is higher than the voltage applied to the source terminal and therefore, the first PMOS 31, the first PDMOS 32, the second PMOS 41, and the second PDMOS 42 enter the OFF state. In this case of reversed connection of the voltage source, current may flow through the following first to seventh paths 51a, 51b, 52a, 52b, 53a, 54a, and 55a.

The first to seventh paths 51a, 51b, 52a, 52b, 53a, 54a, and 55a are current paths separated according to the first to fifth nodes 51 to 55 connected to the ground terminal 12. The first node 51 is a connection point of the ground terminal 12 and the anode terminal of the first Zener diode 22. The second node 52 is a connection point of the ground terminal 12 and the second resistor element 33. The third node 53 is a connection point of the ground terminal 12 and the fourth Zener diode 10. The fourth node 54 is a connection point of the ground terminal 12 and an internal ground terminal (not depicted) of the integrated circuit 5. The fifth node 55 is a connection point of the ground terminal 12 and the anode (a drain electrode 100 of the second PDMOS 42) of a parasitic diode 65 of a p⁻-type semiconductor substrate 70 described hereinafter (refer to FIG. 5).

The first path 51a is a current path from the ground terminal 12, through the first Zener diode 22 and the first resistor element 21, to the external power supply terminal 11. The second path 51b is a current path from the ground terminal 12, through the first Zener diode 22, the third resistor element 6, and the second Zener diode 7, to a parasitic diode (body diode) 61 of the first PMOS 31. The third path 52a is a current path from the ground terminal 12, through the second resistor element 33 and a parasitic diode (body diode) 62 of the first PDMOS 32, to the parasitic diode 61 of the first PMOS 31. The fourth path 52b is a current path from the ground terminal 12, through the second resistor element 33, the fourth resistor element 8, and the third Zener diode 9, to a parasitic diode (body diode) 63 of the second PMOS 41. The fifth path 53a is a current path from the ground terminal 12, through the fourth Zener diode 10 and a parasitic diode (body diode) 64 of the second PDMOS 42, to the parasitic diode 63 of the second PMOS 41. The sixth path 54a is a current path from the ground terminal 12, through the internal ground terminal, the integrated circuit 5, the internal power supply terminal 13, and the parasitic diode 64 of the second PDMOS 42, to the parasitic diode 63 of the second PMOS 41. The seventh path 55a is a current path from the ground terminal 12, through the parasitic diode 65 of the p⁻-type semiconductor substrate 70, to the parasitic diode 63 of the second PMOS 41.

Current that flows through the first path 51a in a case of reversed connection of the voltage source may be suppressed to an extent that no problem arises by making the first resistor element 21 a poly-silicon resistor that does not cause a parasitic path in the p⁻-type semiconductor substrate 70 and by making the resistance value of the first resistor element 21 sufficiently large. The resistance value of the first resistor element 21, for example, is set to be large to an extent that destruction does not occur consequent to electromigration of current flowing in the first path 51a, in a case of reversed connection of the voltage source. In particular, the resistance value of the first resistor element 21 may be, for example, about a few dozen kΩ or more.

In a case of reversed connection of the voltage source, in paths other than the first path 51a, current may be inhibited by the parasitic diode 61 of the first PMOS 31 or the parasitic diode 63 of the second PMOS 41. In particular, in a case of reversed connection of the voltage source, since the parasitic diode 61 of the first PMOS 31 connected to the external power supply terminal 11 is reverse-biased, current in the second and third paths 51b, 52a is inhibited. Since the parasitic diode 63 of the second PMOS 41 connected to the external power supply terminal 11 is reverse-biased, current in the fourth to seventh paths 52b, 53a, 54a, 55a is inhibited.

Further, when the second PMOS 41 and the first PMOS 31 of a depression type is used, operation of the protection circuit 1 in the steady-state and in a case of overvoltage application is the same as in the case in which the second PMOS 41 and the first PMOS 31 of an enhancement type described above are used, excluding when the first PMOS 31 and the second PMOS 41 maintain the ON state. When the second PMOS 41 and the first PMOS 31 of a depression type are used, the gate threshold voltages of the first and second PMOSs 31, 41 are adjusted so that the voltage applied to the gate terminal becomes higher than the voltage applied to the source terminal, in a case of reversed connection of the voltage source. As a result, operation of the protection circuit 1 in a case of reversed connection of the voltage source may be made the same as that in a case in which the second PMOS 41 and the first PMOS 31 of an enhancement type are used as described above.

In particular, in the steady-state, as described above, the gate voltages (≈Vga) of the first PMOS 31 and of the first PDMOS 32 become about the power supply voltage Vcc. Therefore, the first PMOS 31 enters an ON state (state of higher resistance that a normal inversion state) that is closer to OFF than the normal ON state and the first PDMOS 32 maintains the OFF state. The first PDMOS 32 being OFF, as described above, causes the gate voltages (≈Vgb) of the second PMOS 41 and the second PDMOS 42 to become about the ground voltage GND. As a result, the second PMOS 41 transitions to an always ON state and the second PDMOS 42 turns ON. The second PMOS 41 and the second PDMOS 42 being ON, as described above, causes the power supply voltage Vcc of the external power supply terminal 11 to be supplied to the internal power supply terminal 13, and the internal power supply voltage Vdd from the internal power supply terminal 13 to be supplied to the integrated circuit 5.

In a case of overvoltage application, when the power supply voltage Vcc becomes a voltage value that is a sum of the breakdown voltage Vr of the first Zener diode 22 and the gate threshold voltage Vth of the first PDMOS 32 or greater (Vcc≥Vr+Vth), the first PMOS 31 enters a normal ON state from the ON state close to OFF, and the first PDMOS 32 transitions from the OFF state to the ON state. Since the first PMOS 31 and the first PDMOS 32 are ON, as described above, the voltage Vgb of the connection point 34 of the drain terminal D of the first PDMOS 32 and the second resistor element 33 becomes about the power supply voltage Vcc (Vgb≈Vcc). As a result, the second PMOS 41 transitions to the ON state that is closer to OFF than the normal ON state, and the second PDMOS 42 transitions from the ON state to the OFF state. The second PDMOS 42 being OFF enables the potential of the power supply voltage Vcc of the internal power supply terminal 13 to be reduced and enables the integrated circuit 5 to be protected from overvoltage.

In a case of reversed connection of the voltage source, the voltages applied to the gate terminals of the first and second PMOSs 31, 41 become about the voltage applied to the ground terminal 12. The voltage applied to the source terminal of the first PMOS 31 becomes a voltage that is a difference of the potential of the ground terminal 12 minus a voltage drop (for example, 0.6V when a silicon substrate is used) of the parasitic diode 62 of the first PDMOS 32. For example, when the voltage applied to the ground terminal 12 is 5V, a voltage of 5V is applied to the gate terminal of the first PMOS 31, and a voltage of about 4.4V (≈5V-0.6V) is applied to the source terminal. Since the voltage applied to the gate terminal is higher than the voltage applied to the source terminal, the first PMOS 31 enters the ON state that is close to OFF, and the parasitic diode 61 of the first PMOS 31 is reverse-biased. As a result, current on the second and third paths 51b, 52a may be reduced. By making the second resistor element 33 of high resistance, the current on the second and third paths 51b, 52a may be further suppressed. The voltage applied to the source terminal of the second PMOS 41 becomes a voltage that is a difference of the potential of the ground terminal 12 minus the voltage drop of the fourth Zener diode 10 and the parasitic diode 64 of the second PMOS 42. In particular, for example, when the voltage applied to the ground terminal 12 is 5V, a voltage of 5V is applied to the gate terminal of the second PMOS 41, and a voltage of about 3.8V (≈5V-1.2V) is applied to the source terminal. Since the voltage applied to the gate terminal is sufficiently higher than the voltage applied to the source terminal, the second PMOS 41 enters a substantially OFF state, and the parasitic diode 63 of the second PMOS 41 is reverse-biased. As a result, current on the fourth to seventh paths 52b, 53a, 54a, 55a described above may be substantially inhibited.

Figure 5:
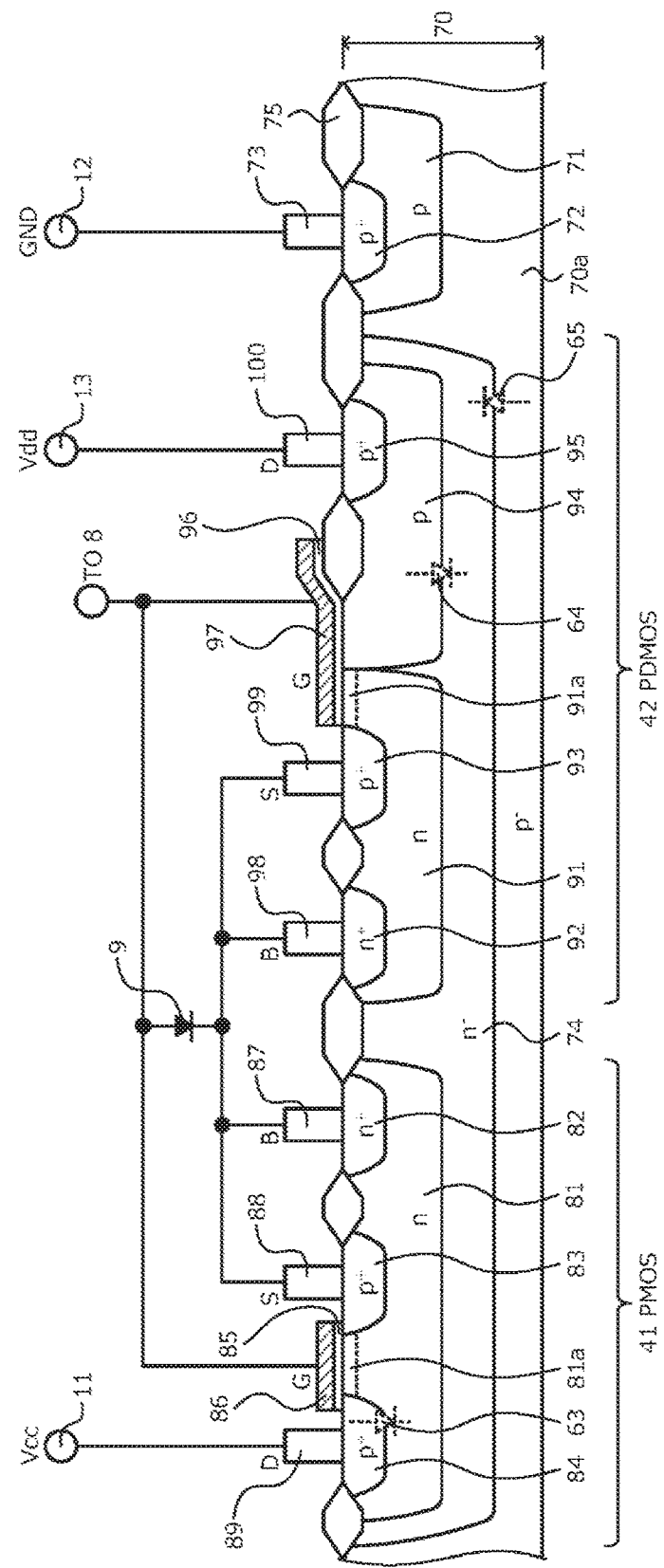
FIG. 5 is a cross-sectional view of a portion of the protection circuit depicted in FIG. 1.

A cross-section of a structure of the protection circuit 1 will be described. FIG. 5 is a cross-sectional view of a portion of the protection circuit depicted in FIG. 1. FIG. 5 depicts a cross-sectional view of the second PMOS 41 and the second PDMOS 42. A cross-sectional view of the structures of the first PMOS 31 and the first PDMOS 32 are respectively identical to those of the second PMOS 41 and the second PDMOS 42. Although not depicted, the first PMOS 31, the first PDMOS 32, the first to fourth resistor elements 21, 33, 6, 8, and the first to fourth Zener diodes 22, 7, 9, 10 are arranged on the same p$^-$-type semiconductor substrate 70 as the second PMOS 41 and the second PDMOS 42.

As depicted in FIG. 5, in a surface layer on a front surface of the p$^-$-type semiconductor substrate 70, a p-type well region 71 is selectively provided. In the p-type well region 71 (surface region on a substrate front surface side), a p$^+$-type contact region 72 is selectively provided. A contact electrode 73 is in contact with the p$^+$-type contact region 72. Further, the contact electrode 73 is electrically connected with the ground terminal 12. In the p$^-$-type semiconductor substrate 70, in the steady-state, the potential of the ground voltage GND is supplied from the contact electrode (hereinafter, GND contact electrode) 73, via the p-type well region 71 and the p$^+$-type contact region 72.

Further, in the surface layer on the front surface of the p$^-$-type semiconductor substrate 70, an n$^-$-type well region 74 is selectively provided separate from the p-type well region 71. A diffusion depth of the n$^-$-type well region 74, for example, is deeper than a diffusion depth of the p-type well region 71. By a pn junction between the n$^-$-type well region 74 and a p$^-$-type region 70a on a rear surface side, the parasitic diode 65 of the p$^-$-type semiconductor substrate 70 described above is formed. The p$^-$-type region 70a on the rear surface side is a portion of the p$^-$-type semiconductor substrate 70 remaining as a p-type region deeper than the p-type well region 71 and n$^-$-type well region 74 from the substrate front surface since these regions are not formed.

In the n$^-$-type well region 74, the second PMOS 41 is arranged. In particular, in a portion of the n$^-$-type well region 74 on the substrate front surface side, an n-type body region (back gate) 81 is selectively provided. In the n-type body region 81, an n$^+$-type contact region 82, a p$^+$-type source region 83, and a p$^+$-type drain region 84 are selectively provided. On a surface of a portion of the n-type body region 81 between the p$^+$-type source region 83 and the p$^+$-type drain region 84, a gate electrode 86 containing, for example, poly-silicon is provided, via a gate insulating film 85. The n-type body region 81, the n$^+$-type contact region 82, the p$^+$-type source region 83, the p$^+$-type drain region 84, the gate insulating film 85, and the gate electrode 86 constitute a MOS gate structure of the second PMOS 41.

The second PMOS 41 may be controlled to be an enhancement type or a depression type by the ion species implanted in a channel portion 81a and the impurity concentration of the channel portion 81a, and in terms of cross-sectional structure, there is essentially no difference between an enhancement type and a depression type. The channel portion 81a of the second PMOS 41 is a portion of the n-type body region 81 directly beneath the gate electrode 86 (a portion facing the gate electrode 86 across the gate insulating film 85 in a depth direction). A contact electrode 87, a source electrode 88, and a drain electrode 89 of the second PMOS 41 are in contact with the n$^+$-type contact region 82, the p$^+$-type source region 83, and the p$^+$-type drain region 84, respectively. At a pn junction between the p$^+$-type drain region 84 and the n-type body region 81, the parasitic diode 63 of the second PMOS 41 is formed.

Further, in the n$^-$-type well region 74, the second PDMOS 42 is arranged. In particular, at a portion of the n$^-$-type well region 74 on the substrate front surface side, separate from the n-type body region 81 of the second PMOS 41, an n-type body region (back gate) 91 and the p-type offset region 94 of the second PDMOS 42 are each selectively provided. In the n-type body region 91, an n$^+$-type contact region 92 and a p$^+$-type source region 93 are each selectively provided. On a portion of the surface of the p-type offset region 94, a thick local oxidation film 75 such a local oxidation of silicon (LOCOS) is selectively provided.

In the p-type offset region 94, on an opposite side from a side nearest the p$^+$-type source region 93, a p$^+$-type drain region 95 is selectively provided sandwiching the local oxidation film 75 with the p$^+$-type source region 93. On a surface of a portion of the n-type body region 91 between the p$^+$-type source region 93 and the p-type offset region 94, a gate electrode 97 containing, for example, poly-silicon is provided, via a gate insulating film 96. The gate electrode 97 may extend on the local oxidation film 75 provided between the p$^+$-type source region 93 and the p$^+$-type drain region 95. The n-type body region 91, the n$^+$-type contact region 92, the p$^+$-type source region 93, the p-type offset region 94, the p$^+$-type drain region 95, the gate insulating film 96, and the gate electrode 97 constitute a MOS gate structure of the second PDMOS 42.

The second PDMOS 42 is controlled to be an enhancement type by the ion species implanted in a channel portion 91a and the impurity concentration of the channel portion 81a. The channel portion 91a of the second PDMOS 42 is a portion of the n-type body region 91 directly beneath the gate electrode 97 (a portion facing the gate electrode 97 across the gate insulating film 96 in the depth direction). A contact electrode 98, a source electrode 99, and the drain electrode 100 of the second PDMOS 42 are in contact with the n$^+$-type contact region 92, the p$^+$-type source region 93, and the p$^+$-type drain region 95, respectively. At a pn junction between the p-type offset region 94 and the n$^-$-type well region 74, the parasitic diode 64 of the second PDMOS 42 is formed.

In an anode region of the third Zener diode 9, the gate electrode 86 of the second PMOS 41, the gate electrode 97 of the second PDMOS 42, and the fourth resistor element 8 are electrically connected. In a cathode region of the third Zener diode 9, the contact electrode 87 of the second PMOS 41 and the source electrode 88 are electrically connected with the contact electrode 98 of the second PDMOS 42 and the source electrode 99. The drain electrode 89 of the second PMOS 41 is electrically connected to the external power supply terminal 11. The drain electrode 100 of the second PDMOS 42 is electrically connected to the internal power supply terminal 13.

Regions of the second PMOS 41 and the second PDMOS 42 may be concurrently formed with regions the MOSFET constituting the integrated circuit 5 and having an identical conductivity type, impurity concentration, and diffusion depth. Therefore, regions of the second PMOS 41 and of the second PDMOS 42 may be formed without additional processes such as ion implantation or dedicated masks for forming the regions. Thus, since the second PMOS 41 and the second PDMOS 42 may be produced essentially without additional processes or dedicated masks, the protection circuit 1 is produced concurrently with the production of the integrated circuit 5 that is a CMOS integrated circuit.

States of the channel portions 81a, 91a in the steady-state, in a case of overvoltage application, and in a case of reversed connection of the voltage source of the second PMOS 41 and the second PDMOS 42 will be described with reference to FIGS. 5 and 6. FIG. 6 is a table of states of the channel portion of the PMOS and the PDMOS depicted in FIG. 5. When the second PMOS 41 is an enhancement type, the channel portion 81a of the second PMOS 41 turns ON (inversion state) in the steady-state, turns OFF (non-inversion state) in a case of overvoltage application, and turns OFF (non-inversion state) in a case of reversed connection of the voltage source.

When the second PMOS 41 is a depression type, the channel portion 81a of the second PMOS 41 turns ON (inversion state) in the steady-state, and enters the ON state that is closer to OFF than the normal ON state is (weak inversion state) in a case of overvoltage application. In a case of reversed connection of the voltage source, as described above, a voltage of 5V is applied to the gate terminal G of the second PMOS 41, and a voltage of about 3.8V (≈5V-1.2V) is applied to the source terminal S. Consequently, the channel portion 81a of the second PMOS 41 turns OFF (non-inversion state) when the gate threshold voltage value is −1.2V or higher and 0V or less, and enters the ON state that is closer to OFF than the normal ON state is (weak inversion state) when the gate threshold voltage value is less than −1.2V.

The second PDMOS 42 is an enhancement type. The channel portion 91a of the second PDMOS 42 turns ON (inversion state) in the steady-state, turns OFF (non-inversion state) in a case of overvoltage application, and turns OFF (non-inversion state) in a case of reversed connection of the voltage source.

Figure 7:
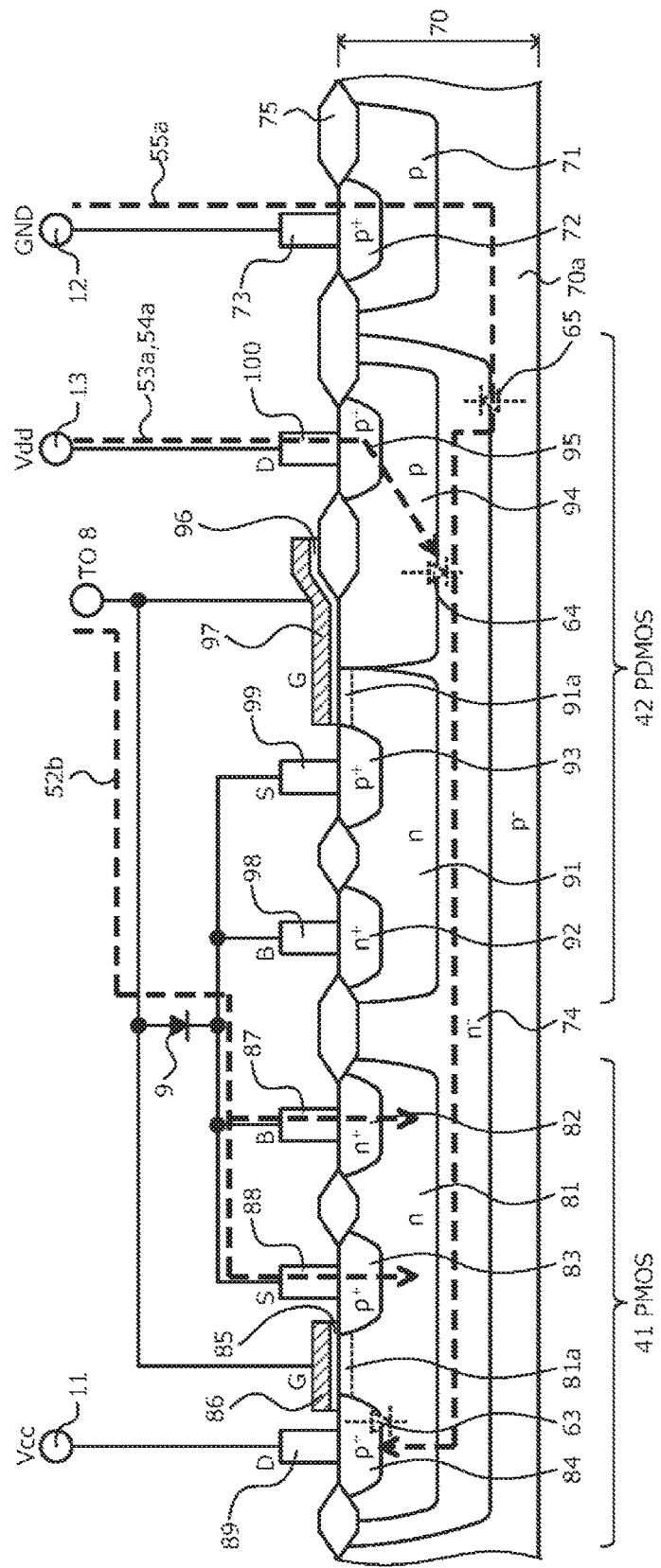
FIG. 7 is a diagram of current paths in a case of reversed connection of the voltage source of the PMOS and the PDMOS depicted in FIG. 5.
Figure 8:
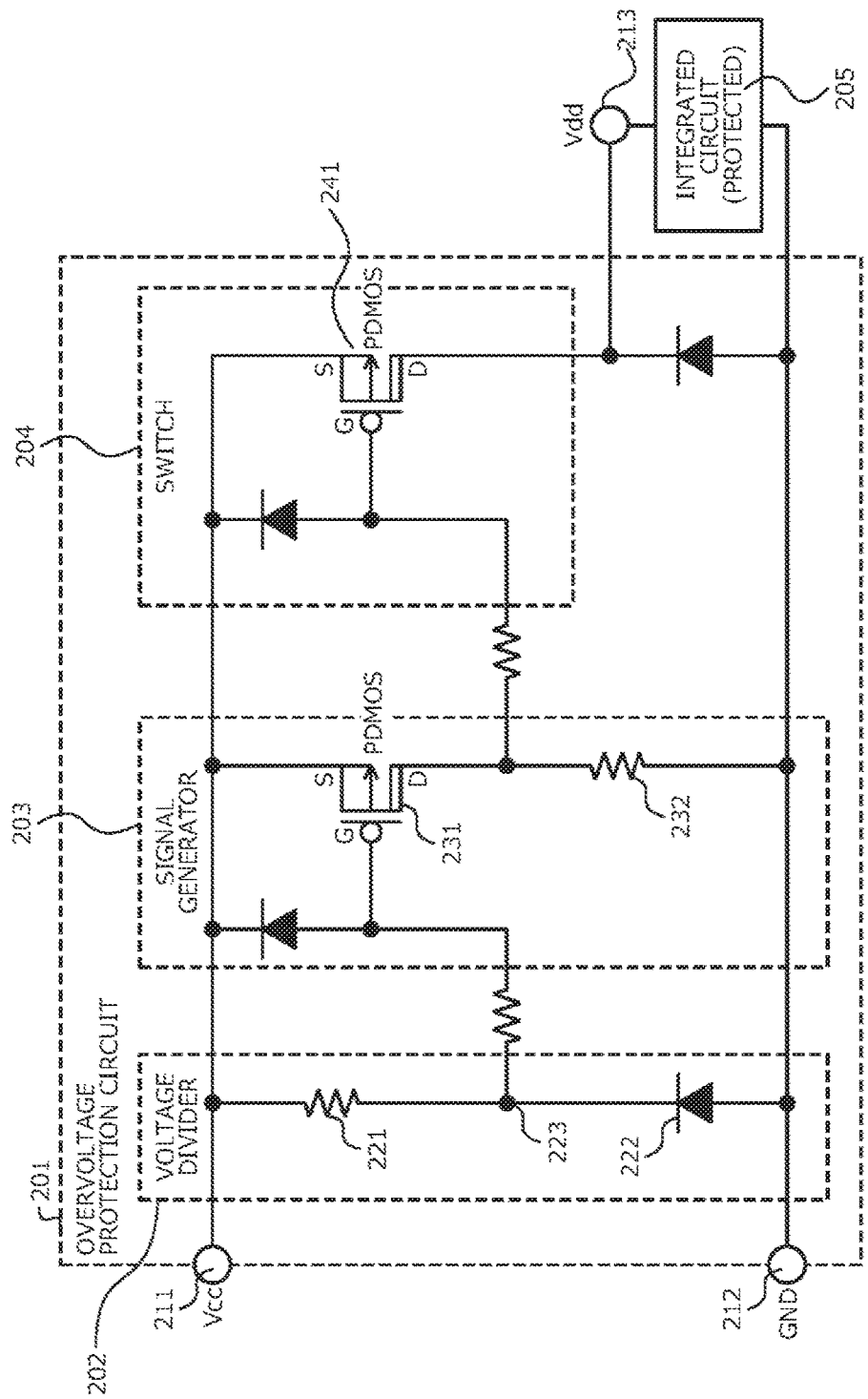
FIG. 8 is a circuit diagram of a conventional overvoltage protection circuit.

In the p$^-$-type semiconductor substrate 70, regions passed by the fourth to seventh paths 52b, 53a, 54a, 55a (refer to FIG. 4) through which current may flow in a case of reversed connection of the voltage source will be described. FIG. 7 is a diagram of current paths in a case of reversed connection of the voltage source of the PMOS and the PDMOS depicted in FIG. 5. Each of the fourth to seventh paths 52b, 53a, 54a, 55a through which current may flow in a case of reversed connection of the voltage source, ultimately, reaches the drain electrode 89 of the second PMOS 41 connected to the external power supply terminal 11.

In particular, in the fourth path 52b, current attempts to flow through the fourth resistor element 8, the third Zener diode 9, and the contact electrode 87 and the n$^+$-type contact region 82 of the second PMOS 41, from the n-type body region 81 to the p$^+$-type drain region 84. Alternatively, in the fourth path 52b, current attempts to flow through the fourth resistor element 8, the third Zener diode 9, and the source electrode 88 and the p$^+$-type source region 83 of the second PMOS 41, from the n-type body region 81 to the p$^+$-type drain region 84.

In the fifth path 53a, current attempts to flow through the fourth Zener diode 10 (refer to FIG. 4), the drain electrode 100, the p$^+$-type drain region 95, and the parasitic diode 64 of the second PDMOS 42, from the n-type body region 81 to the p$^+$-type drain region 84. In the sixth path 54a, current attempts to flow through the integrated circuit 5, the internal power supply terminal 13 (refer to FIG. 4), and the drain electrode 100, the p$^+$-type drain region 95, and the parasitic diode 64 of the second PDMOS 42, from the n-type body region 81 to p$^+$-type drain region 84.

Current flowing in the seventh path 55a attempts to flow through the GND contact electrode 73, the p$^+$-type contact region 72, the p-type well region 71, and the parasitic diode 65 of the p$^-$-type semiconductor substrate 70, from the n-type body region 81 to the p$^+$-type drain region 84. In a case of reversed connection of the voltage source, the p$^+$-type drain region 84 in contact with the drain electrode 89 of the second PMOS 41 is fixed to the potential of the ground voltage GND whereby the parasitic diode 63 of the second PMOS 41 formed at the pn junction with the n-type body region 81 enters a reversed bias state. Thus, as described above, current flowing through the fourth to seventh paths 52b, 53a, 54a, 55a is inhibited.

As described, according to the embodiment, on the external power supply terminal side of a PDMOS of a signal generator and on the external power supply terminal side of a PDMOS of a switch, a PMOS in which a parasitic diode is reverse-biased in a case of reversed connection of the voltage source is connected. As a result, in a case of overvoltage application, the voltage of a voltage dividing point of a voltage divider is clamped to the breakdown voltage of a Zener diode, the PDMOS of the switch is turned OFF, and supply to an integrated circuit that is to be protected from overvoltage is cut off. Additionally, when the voltage source is connected in reverse, the parasitic diode of the PMOS is reverse-biased, enabling the flow of current along a path through the parasitic diode of the PMOS to be inhibited and the flow of a large current to the protected integrated circuit to be suppressed.

The described invention is not limited to the embodiment described and various modifications within a scope not deviating from the spirit of the invention are possible. Furthermore, the present invention is similarly implemented when the conduction types are reversed.

Nonetheless, Japanese Laid-Open Patent Publication No. 2003-303890 describes a technique related to an overvoltage protection function and when the voltage source is connected in reverse, the MOSFET that is a switch, turns ON, making cut off of the current supplied to the integrated circuit impossible. Further, in the MOSFET constituting the signal generator, a path that cannot cut off current consequent to the reversed connection of the voltage source is formed. Therefore, when the voltage source is connected in reverse, the integrated circuit cannot be protected in a case of reversed connection of the voltage source, requiring an additional countermeasure such as providing an external protection circuit.

Japanese Laid-Open Patent Publication Nos. H10-289956 and 2002-095159, Japanese Patent Nos. 5603277 and 2804333, and Japanese Laid-Open Patent Publication No. S63-255956 describe techniques related to a protection function against reversed connection of the voltage source, and do not achieve both a protection function against reversed connection of the voltage source and an overvoltage protection function. Therefore, to add an overvoltage protection function, an additional protection circuit is necessary. Further, in Japanese Laid-Open Patent Publication No. H10-289956, to produce the npn transistor implementing a protection function against reversed connection of the voltage source, in addition to an ordinary CMOS manufacturing process, additional processes are necessary, arising in a problem of increased manufacturing cost.

In Japanese Laid-Open Patent Publication No. 2014-082922, without changing the chip area (chip size), reduction of the steady-state ON resistance of the first NMOS that drives the gate by the power supply voltage from the power supply terminal is difficult. Further, when the voltage source is connected to the integrated circuit in reverse and the switching speed of the second NMOS that drives the gate by the power supply voltage from the ground terminal is slow, surge current entering the internal circuit is not completely cut off and thus, surge current may be input from the internal power source node to the internal circuit.

According to the invention described above, an case of overvoltage application, the voltage of the voltage dividing point of the voltage divider is clamped to the breakdown voltage of the Zener diode, the second metal oxide semiconductor field effect transistor turns OFF, and supply to the integrated circuit that is to be protected from overvoltage is cut off. Additionally, when the voltage source is connected in reverse, the parasitic diodes of the third and fourth metal oxide semiconductor field effect transistors are reverse-biased, enabling the flow of current in a path through the parasitic diodes of the third and fourth metal oxide semiconductor field effect transistors to be inhibited and the flow of a large current to the protected integrated circuit to be suppressed.

The semiconductor integrated circuit device according to the present invention achieves an effect in that a semiconductor integrated circuit device having a function of protecting against overvoltage and a function of protecting against reversed connection of the voltage source may be provided.

As described, the semiconductor integrated circuit device according to the present invention is useful for semiconductor devices used for automotive applications and in particular, is suitable for semiconductor devices including a physical quantity sensor such as a pressure sensor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device comprising:
   an external power supply terminal supplied a power supply voltage from outside the semiconductor integrated circuit device, in a steady-state;
   a ground terminal supplied a ground voltage from outside the semiconductor integrated circuit device, in the steady-state;
   an internal power supply terminal supplying, to an integrated circuit to be protected, the power supply voltage supplied from outside the semiconductor integrated circuit device, in the steady-state;
   a voltage divider dividing voltage supplied from the external power supply terminal, the voltage divider connected between the external power supply terminal and the ground terminal;
   a signal generator including an inverter circuit formed by a serially-connected member formed by connecting a first end of a first resistor element to a drain terminal of a first metal oxide semiconductor field effect transistor connected between the external power supply terminal and the ground terminal, the first metal oxide semiconductor field effect transistor outputting any one of the power supply voltage and the ground voltage according to a voltage of a voltage dividing point of the voltage divider, the first metal oxide semiconductor field effect transistor having, as an input terminal, a gate terminal connected to the voltage dividing point, and having a drain terminal as an output terminal; and
   a switch switching output of the signal generator, the switch including a second metal oxide semiconductor field effect transistor connected between the external power supply terminal and the ground terminal, a drain terminal of the second metal oxide semiconductor field effect transistor being connected to the internal power supply terminal, and a gate terminal of the second metal oxide semiconductor field effect transistor being connected to a connection point of the drain terminal of the first metal oxide semiconductor field effect transistor and the first end of the first resistor element, wherein
   the signal generator further includes a third metal oxide semiconductor field effect transistor, a drain terminal of the third metal oxide semiconductor field effect transistor being connected to the external power supply terminal, a source terminal of the third metal oxide semiconductor field effect transistor being connected to a source terminal of the first metal oxide semiconductor field effect transistor, and a gate terminal of the third metal oxide semiconductor field effect transistor being connected to the voltage dividing point, and
   the switch further includes a fourth metal oxide semiconductor field effect transistor, a drain terminal of the fourth metal oxide semiconductor field effect transistor being connected to the external power supply terminal, a source terminal of the fourth metal oxide semiconductor field effect transistor being connected to a source terminal of the second metal oxide semiconductor field effect transistor, and a gate terminal of the fourth metal oxide semiconductor field effect transistor being connected to the connection point.

2. The semiconductor integrated circuit device according to claim 1, wherein
   the third metal oxide semiconductor field effect transistor is an enhancement-type p-channel metal oxide semiconductor field effect transistor.

3. The semiconductor integrated circuit device according to claim 1, wherein
   the fourth metal oxide semiconductor field effect transistor is an enhancement-type p-channel metal oxide semiconductor field effect transistor.

4. The semiconductor integrated circuit device according to claim 1, wherein
   the third metal oxide semiconductor field effect transistor is a depression-type p-channel metal oxide semiconductor field effect transistor.

5. The semiconductor integrated circuit device according to claim 1, wherein
   the fourth metal oxide semiconductor field effect transistor is a depression-type p-channel metal oxide semiconductor field effect transistor.

6. The semiconductor integrated circuit device according to claim 4, wherein
   a gate threshold voltage of the fourth metal oxide semiconductor field effect transistor is set so that a voltage applied to the gate terminal of the fourth metal oxide semiconductor field effect transistor becomes higher than a voltage applied to the source terminal of the fourth metal oxide semiconductor field effect transistor, when the ground voltage is supplied to the external power supply terminal and the power supply voltage is supplied to the ground terminal.

7. The semiconductor integrated circuit device according to claim 1, wherein
the first metal oxide semiconductor field effect transistor and the second metal oxide semiconductor field effect transistor are each an enhancement-type p-channel metal oxide semiconductor field effect transistor.

8. The semiconductor integrated circuit device according to claim 1, wherein
the voltage divider includes another serially-connected member in which a Zener diode is connected in series to a second resistor element, and
a breakdown voltage of the Zener diode is a maximum rated voltage of the integrated circuit or less.

9. The semiconductor integrated circuit device according to claim 1, wherein
the integrated circuit includes a plurality of metal oxide semiconductor field effect transistors.

10. The semiconductor integrated circuit device according to claim 1, wherein
the voltage divider, the signal generator, and the switch are formed on a single semiconductor substrate with the integrated circuit.

11. The semiconductor integrated circuit device according to claim 5, wherein
a gate threshold voltage of the fourth metal oxide semiconductor field effect transistor is set so that a voltage applied to the gate terminal of the fourth metal oxide semiconductor field effect transistor becomes higher than a voltage applied to the source terminal of the fourth metal oxide semiconductor field effect transistor, when the ground voltage is supplied to the external power supply terminal and the power supply voltage is supplied to the ground terminal.

* * * * *